(12) United States Patent
Eklund et al.

(10) Patent No.: US 8,441,379 B2
(45) Date of Patent: May 14, 2013

(54) DEVICE AND METHOD FOR DIGITIZING A SIGNAL

(75) Inventors: Jan-Erik Eklund, Linköping (SE); Linnéa Rosenbaum, Linköping (SE)

(73) Assignee: Signal Processing Devices Sweden AB, Linköping (SE)

( * ) Notice: Subject to any disclaimer, the term of this patent is extended or adjusted under 35 U.S.C. 154(b) by 57 days.

(21) Appl. No.: 13/146,973

(22) PCT Filed: Feb. 11, 2009

(86) PCT No.: PCT/EP2009/051589
§ 371 (c)(1),
(2), (4) Date: Sep. 21, 2011

(87) PCT Pub. No.: WO2010/091726
PCT Pub. Date: Aug. 19, 2010

(65) Prior Publication Data
US 2012/0001783 A1   Jan. 5, 2012

(51) Int. Cl.
*H03M 1/10* (2006.01)
(52) U.S. Cl.
USPC .......................................... 341/120; 341/155
(58) Field of Classification Search .................. 341/118, 341/120, 155
See application file for complete search history.

(56) References Cited

U.S. PATENT DOCUMENTS

| 7,304,597 B1 * | 12/2007 | LaMarche | 341/155 |
| 7,782,235 B1 * | 8/2010 | Velazquez | 341/118 |
| 2004/0128076 A1 * | 7/2004 | Pupalaikis et al. | 702/16 |

FOREIGN PATENT DOCUMENTS

| EP | 1726966 A1 | 11/2006 |
| WO | 2008156400 A1 | 12/2008 |
| WO | 2008156401 A1 | 12/2008 |

OTHER PUBLICATIONS

Petraglia et al., High-speed A/D Conversion Incorporating a QMF Bank, IEEE Transactions on Instrumentation and Measurement, vol. 41. No. 3, June 1992, pp. 427-431.*

*Primary Examiner* — Howard Williams
(74) *Attorney, Agent, or Firm* — Capitol City TechLaw

(57) ABSTRACT

A device (10) for generating a digital output signal by digitizing an analog input signal is disclosed. The device (10) comprises a first signal path comprising a first ADC (20a) arranged to convert a first component of the analog input signal, residing in a first frequency band (40), to a first digital signal, and a second signal path comprising a second ADC (20b) arranged to convert a second component of the analog input signal, residing in a second frequency band (50), to a second digital signal. The first and the second frequency band (40, 50) overlap, such that there is a common frequency sub band (60), which is comprised in both the first and the second frequency band (40, 50). The device (10) comprises a combination unit (30). The combination unit (10) is adapted to determine, based on signal content of the first and second digital signal in the common frequency sub band (60), at least one parameter indicating a mismatch between the first and the second signal path in the common frequency sub band (60). Furthermore, the combination unit (10) is adapted to generate a first compensated digital signal and a second compensated digital for compensating the mismatch between the first and the second signal path in the common frequency sub band (60). Moreover, the combination unit (10) is adapted to combine the first compensated digital signal and the second compensated digital signal for generating the digital output signal. Corresponding methods are also disclosed.

23 Claims, 6 Drawing Sheets

DEVICE AND METHOD FOR DIGITIZING A SIGNAL

TECHNICAL FIELD

The present invention relates to a device and a method for digitizing a signal, and a method of processing signals within the device.

BACKGROUND

Requirements on measurement equipment for measuring electrical signals, e.g. in terms of frequency bandwidth, are becoming increasingly harder. Digital measurement equipment, such as digital oscilloscopes, digital spectrum analyzers, and the like are often preferred over their analog counterparts, e.g. due to better processing and analysis capabilities. In such digital measurement equipment, analog-to-digital converters (ADCs) are normally utilized to digitize analog signals, thereby forming digital signals.

The signal frequency bandwidth that the digital measurement equipment should be capable of handling may in some applications extend from a few Hz up to several GHz, or even higher. Such relatively hard bandwidth requirements on the digital measurement equipment in turn impose relatively hard bandwidth requirements on analog circuitry in the interfaces between analog input ports and ADCs of the digital measurement equipment. Examples of such analog circuitry include circuitry for converting an analog signal from a single-ended to a differential representation, impedance converters, buffers, and the like. One solution to design such analog circuitry is to use amplifier circuitry including amplifiers with wide-enough bandwidth to cope with the requirements. However, the design and manufacture of such amplifiers is normally far from trivial, which can result in an undesirably high production cost. An alternative solution for providing conversion from single-ended to differential signal representation, and also for providing impedance conversion if necessary, is to use a passive circuit normally referred to as a balun. A balun may be designed to handle relatively high signal frequencies at a comparably lower cost than the above-mentioned amplifier circuitry. However, a balun normally has relatively poor signal transfer properties in a low-frequency band, extending from 0 Hz up to some frequency that depends on the particular type of balun. Hence, covering the whole signal frequency band of interest using a balun in said interface might not be possible.

SUMMARY

An object of the present invention is to facilitate digitizing analog signals with a relatively wide bandwidth.

According to a first aspect, there is provided a device for generating a digital output signal by digitizing an analog input signal. The device comprises a first signal path comprising a first analog-to-digital converter (ADC) arranged to convert a first component of the analog input signal, residing in a first frequency band, to a first digital signal. Furthermore, the device comprises a second signal path comprising a second ADC arranged to convert a second component of the analog input signal, residing in a second frequency band, to a second digital signal. The first and the second frequency band overlap, such that there is a common frequency sub band, which is comprised in both the first and the second frequency band. Moreover, the device comprises a combination unit. The combination unit is adapted to determine, based on signal content of the first and second digital signal in the common frequency sub band, at least one parameter indicating a mismatch between the first and the second signal path in the common frequency sub band. Furthermore, the combination unit is adapted to generate a first compensated digital signal and a second compensated digital signal based on the first digital signal and the second digital signal, respectively, and on the at least one parameter for compensating the mismatch between the first and the second signal path in the common frequency sub band. Moreover, the combination unit is adapted to combine the first compensated digital signal and the second compensated digital signal for generating the digital output signal.

The combination unit may be adapted to filter the first compensated digital signal with a first filter function for generating a first filtered digital signal. Furthermore, the combination unit may be adapted to filter the second compensated digital signal with a second filter function for generating a second filtered digital signal. Moreover, the combination unit may be adapted to generate the digital output signal as the sum of the first filtered digital signal and the second filtered digital signal. The second filter function may be essentially complementary to the first filter function. The first filter function and the second filter function may have their transition bands within the frequency region in which the first frequency band and the second frequency band overlap.

One of the at least one parameter may be a delay parameter indicating a mutual delay between the first and the second signal path.

The combination unit may be adapted to generate a plurality of mutually delayed versions of the signal content of the first digital signal in the common frequency sub band. Furthermore, the combination unit may be adapted to, for each of said versions, generate a correlation between that version and the signal content of the second digital signal in the common frequency sub band. Moreover, the combination unit may be adapted to determine the delay parameter based on the generated correlations.

Each of said correlations may be a correlation between a sign bit of said version and a sign bit of the signal content of the second digital signal in the common frequency sub band.

The combination unit may be adapted to generate a first delayed copy of the first digital signal having a delay D−d1 with respect to the first digital signal, a second delayed copy of the first digital signal having a delay D with respect to the first digital signal, and a third delayed copy of the second digital signal having a delay D+d2 with respect to the first digital signal. D may be the delay parameter and d1 and d2 may have positive nonzero values. The combination unit may be adapted to filter each of the first, second, and third delayed copies of the first digital signal to generate a first, second, and third one, respectively, of the mutually delayed versions of the signal content of the first digital signal in the common frequency sub band. Furthermore, the combination unit may be adapted to filter the second digital signal to generate the signal content of the second digital signal in the common frequency sub band. Moreover, the combination unit may be adapted to adjust the delay parameter D such that the correlation between the second one of said versions and the signal content of the second digital signal in the common frequency sub band is larger than the correlation between the first one of said versions and the signal content of the second digital signal in the common frequency sub band and larger than the correlation between the third one of said versions and the signal content of the second digital signal in the common frequency sub band. The second delayed copy of the first digital signal may be the first compensated digital signal.

The combination unit may, in some embodiments, be adapted either to generate the first compensated digital signal identical to the first digital signal or to generate the second compensated digital signal identical to the second digital signal.

One of the at least one parameter may be a gain parameter indicating a gain mismatch between the first and the second signal path.

The combination unit may be adapted to generate the gain parameter based on energies of the signal contents in the common frequency sub band of the first digital signal and the second digital signal. Alternatively, the combination unit may be adapted to generate the gain parameter based on average absolute sample values of the signal contents in the common frequency sub band of the first digital signal and the second digital signal.

The combination unit may be adapted to multiply the first digital signal with the gain parameter for generating the first compensated digital signal. Alternatively, the combination unit may be adapted to multiply the second digital signal with the gain parameter for generating the second compensated digital signal.

In some embodiments, the first signal path may have a band-pass characteristic and the second signal path may have a low-pass characteristic.

The first ADC may be arranged to operate at a higher sample rate than the second ADC.

The combination unit may be adapted to perform decimation on a signal derived from the first digital signal for generating signal content of the first digital signal in the common frequency sub band with the same sample rate as the signal content of the second digital signal in the common frequency sub band. Furthermore, the combination unit may be adapted to perform interpolation on a signal derived from the second digital signal for generating the signal content of the second digital signal in the common frequency sub band with a higher sample rate than that of the second digital signal. Moreover, the combination unit may be adapted to perform interpolation on a signal derived from the second digital signal for facilitating generation of the digital output signal.

The device may comprise a passive circuit for generating a differential input signal to the first ADC. The passive circuit may be a balun.

According to a second aspect, there is provided a method of processing signals in a device for generating a digital output signal by digitizing an analog input signal. The device comprises a first signal path comprising a first ADC arranged to convert a first component of the analog input signal, residing in a first frequency band, to a first digital signal. Furthermore, the device comprises a second signal path comprising a second ADC arranged to convert a second component of the analog input signal, residing in a second frequency band, to a second digital signal. Furthermore, the first and the second frequency band overlap, such that there is a common frequency sub band, which is comprised in both the first and the second frequency band. The method comprises determining, based on signal content of the first and second digital signal in the common frequency sub band, at least one parameter indicating a mismatch between the first and the second signal path in the common frequency sub band. Furthermore, the method comprises generating a first compensated digital signal and a second compensated digital signal based on the first digital signal and the second digital signal, respectively, and on the at least one parameter for compensating the mismatch between the first and the second signal path in the common frequency sub band. Moreover, the method comprises combining the first compensated digital signal and the second compensated digital signal for generating the digital output signal.

Combining the first and the second compensated digital signal may comprise filtering the first compensated digital signal with a first filter function for generating a first filtered digital signal. Furthermore, combining the first and the second compensated digital signal may comprise filtering the second compensated digital signal with a second filter function for generating a second filtered digital signal. Moreover, combining the first and the second compensated digital signal may comprise generating the digital output signal as the sum of the first filtered digital signal and the second filtered digital signal. The second filter function may be essentially complementary to the first filter function. The first filter function and the second filter function may have their transition bands within the frequency region in which the first frequency band and the second frequency band overlap.

One of the at least one parameter may be a delay parameter indicating a mutual delay between the first and the second signal path. Determining the delay parameter may comprise generating a plurality of mutually delayed versions of the signal content of the first digital signal in the common frequency sub band. Furthermore, determining the delay parameter may comprise, for each of said versions, generating a correlation between that version and the signal content of the second digital signal in the common frequency sub band. Moreover, determining the delay parameter may comprise determining the delay parameter based on the generated correlations.

Each of said correlations may be a correlation between a sign bit of said version and a sign bit of the signal content of the second digital signal in the common frequency sub band.

Generating the plurality of mutually delayed versions of the signal content of the first digital signal in the common frequency sub band may comprise generating a first delayed copy of the first digital signal having a delay $D-d1$ with respect to the first digital signal, a second delayed copy of the first digital signal having a delay $D$ with respect to the first digital signal, and a third delayed copy of the second digital signal having a delay $D+d2$ with respect to the first digital signal. Furthermore, generating the plurality of mutually delayed versions of the signal content of the first digital signal in the common frequency sub band may comprise filtering each of the first, second, and third delayed copies of the first digital signal to generate a first, second, and third one, respectively, of the mutually delayed versions of the signal content of the first digital signal in the common frequency sub band. $D$ may be the delay parameter and $d1$ and $d2$ may have positive nonzero values. Moreover, generating the delay parameter $D$ may comprise filtering the second digital signal to generate the signal content of the second digital signal in the common frequency sub band. In addition, generating the delay parameter $D$ may comprise adjusting the delay parameter $D$ such that the correlation between the second one of said versions and the signal content of the second digital signal in the common frequency sub band is larger than the correlation between the first one of said versions and the signal content of the second digital signal in the common frequency sub band and larger than the correlation between the third one of said versions and the signal content of the second digital signal in the common frequency sub band. The second delayed copy of the first digital signal may be the first compensated digital signal.

Generating the first compensated digital signal may, in some embodiments, comprise generating the first compensated digital signal identical to the first digital signal. Alternatively, generating the second compensated digital signal may, in some embodiments, comprise generating the second compensated digital signal identical to the second digital signal.

One of the at least one parameter may be a gain parameter indicating a gain mismatch between the first and the second signal path. Generating the gain parameter may comprise generating the gain parameter based on energies of the signal contents in the common frequency sub band of the first digital signal and the second digital signal. Alternatively, generating the gain parameter may comprise generating the gain parameter based on average absolute sample values of the signal contents in the common frequency sub band of the first digital signal and the second digital signal.

Generating the first compensated digital signal may comprise multiplying the first digital signal with the gain parameter. Alternatively, generating the second compensated digital signal may comprise multiplying the second digital signal with the gain parameter.

In some embodiments, the first signal path may have a band-pass characteristic and the second signal path may have a low-pass characteristic.

The first ADC may be arranged to operate at a higher sample rate than the second ADC. The method may comprise performing decimation on a signal derived from the first digital signal for generating signal content of the first digital signal in the common frequency sub band with the same sample rate as the signal content of the second digital signal in the common frequency sub band. Furthermore, the method may comprise performing interpolation on a signal derived from the second digital signal for generating the signal content of the second digital signal in the common frequency sub band with a higher sample rate than that of the second digital signal. Moreover, the method may comprise performing interpolation on a signal derived from the second digital signal for facilitating generation of the digital output signal.

According to a third aspect, there is provided a method of generating a digital output signal by digitizing an analog input signal. The method of the third aspect comprises generating the digital output signal using the method of the second aspect. Furthermore, the method of the third aspect comprises converting said first component of the analog input signal, residing in said first frequency band, to said first digital signal. Moreover, the method of the third aspect comprises converting said second component of the analog input signal, residing in said second frequency band, to said second digital signal.

According to a fourth aspect, there is provided a computer program product comprising computer program code means for executing the method according to the second aspect when said computer program code means are run by an electronic device having computer capabilities.

According to a fifth aspect, there is provided a computer readable medium having stored thereon a computer program product comprising computer program code means for executing the method according to the second aspect when said computer program code means are run by an electronic device having computer capabilities.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
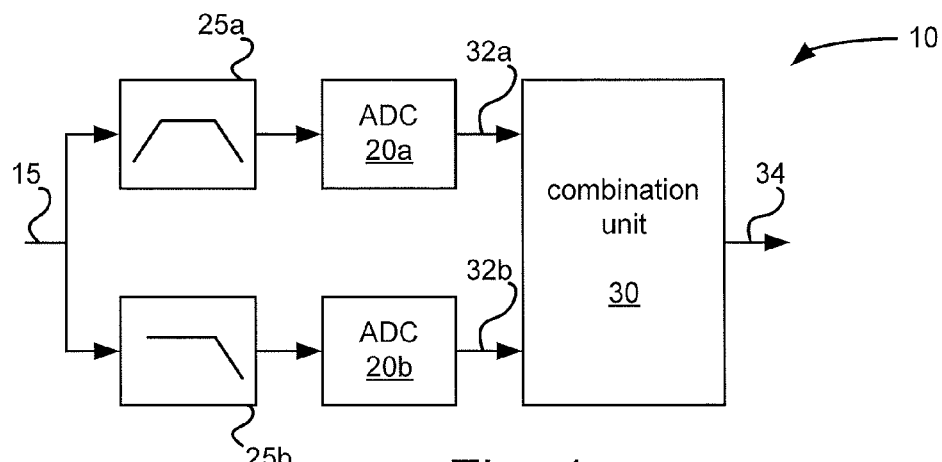
FIG. 1 is a block diagram of a digitizer device according to an embodiment of the present invention.

FIG. 1 is a block diagram of a digitizer device 10 according to an embodiment of the present invention. The digitizer device 10 is adapted to receive an analog input signal on an input port 15. Furthermore, the digitizer device 10 is adapted to generate a digital output signal by digitizing the analog input signal.

According to the embodiment, the digitizer device comprises a first analog-to-digital converter (ADC) 20a in a first signal path of the digitizer device 10. Furthermore, the digitizer device comprises a second ADC 20b in a second signal path of the digitizer device 10.

The first signal path is adapted for a first frequency band, in which the first signal path satisfactorily transfers signals. The first ADC 20a is arranged to convert a first component of the analog input signal, residing in the first frequency band, to a first digital signal. Similarly, the second signal path is adapted for a second frequency band, in which the second signal path satisfactorily transfers signals. The second ADC 20b is arranged to convert a second component of the analog input signal, residing in the second frequency band, to a second digital signal.

As indicated by the boxes 25a and 25b in FIG. 1, the first signal path may have a band-pass characteristic and the second signal path may have a low-pass characteristic. These types of characteristics are assumed for the first and second signal path in the following. However, other characteristics are possible as well. For example, both the first and the second signal paths may have band-pass characteristics.

A passive circuit, such as a balun (not shown), may be used in the first signal path to facilitate conversion from a single-ended signal representation to a differential signal representation, which may be required by the ADC 20a. A balun can provide relatively good signal transfer characteristics for a frequency range extending up to relatively high frequencies, such as several GHz or even higher, depending on the type of balun. Good signal transfer characteristics may, in this context, e.g. mean an essentially constant magnitude response over said frequency range, but may also include an essentially constant group delay (i.e. approximately linear phase response) and/or a relatively high degree of linearity. The requirements in terms of signal transfer properties may be different for different applications, and the type of balun (if used) should be selected based on such requirements such that desired signal transfer properties are obtained.

However, a balun normally provides an inadequate signal transfer for lower frequencies. Hence, there is a lower frequency limit of the frequency range for which the balun provides adequate signal transfer, which in turn results in a band-pass characteristic of the first signal path. In addition to the balun, a filter may be provided in the first signal path to provide a well-defined upper frequency limit of the first signal path to avoid aliasing in the first ADC 20a.

The low-pass characteristic of the second signal path may e.g. be provided by an active or passive filter having a suitable frequency response to avoid aliasing in the second ADC 20b.

According to the embodiment illustrated in FIG. 1, the digitizer device 10 comprises a combination unit 30. The combination unit 30 is arranged to receive the first digital signal from the first ADC 20a on an input port 32a. Furthermore, the combination unit 30 is arranged to receive the second digital signal from the second ADC 20b on an input port 32b. Moreover, the combination unit 30 is adapted to process the first and the second digital signal for generating the digital output signal on an output port 34.

Figure 2:
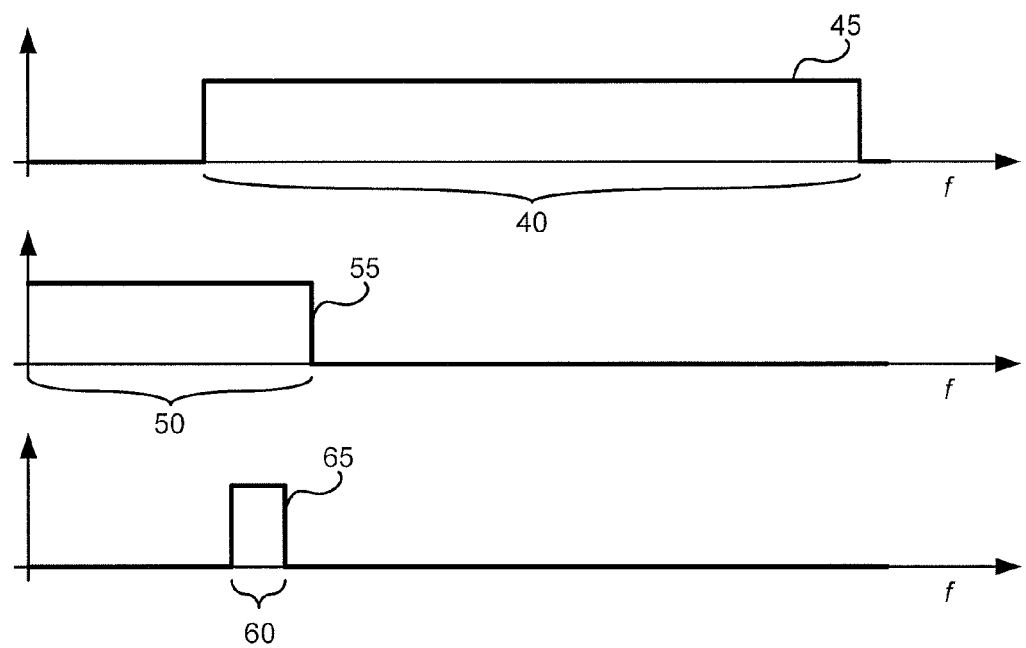
FIG. 2 schematically illustrates frequency bands according to examples.

FIG. 2 schematically illustrates frequency bands according to examples, wherein f denotes frequency. The first frequency band is denoted with the reference number 40 in FIG. 2, and an idealized magnitude response of the first signal path is shown with the reference number 45. Furthermore, the second frequency band is denoted with the reference number 50 in FIG. 2, and an idealized magnitude response of the second signal path is shown with the reference number 55. The idealized magnitude responses 45 and 55 shown in FIG. 2 are plotted with transition bands with zero width and with perfectly constant magnitude within the passbands. In actual physical implementations, the transition bands will of course have nonzero widths and the magnitude responses will not be perfectly constant throughout the passbands. Hence, the plots in FIG. 2 are merely intended as schematic illustrations.

As indicated in FIG. 2, the first and the second frequency band 40, 50 overlap. Thus, there exists a common frequency sub band, denoted 60 in FIG. 2 that is comprised in both the first and the second frequency band 40, 50. According to embodiments of the present invention, the combination unit 30 (FIG. 1) is arranged to utilize signal contents of the first and the second digital signal within the common frequency sub band 60 for compensating mismatch between the two signal paths when generating the digital output signal based on the first and the second digital signal. In order to generate said signal contents, the combination unit 30 may be adapted to filter the first and the second digital signal, or signals derived therefrom, with filters having approximately the (again idealized) magnitude response 65 plotted in FIG. 2.

As indicated in FIG. 2, the common frequency sub band 60 need not necessarily span the whole overlap region, in which the first frequency band 40 and the second frequency band 50 overlap, but may in some embodiments span only a portion of said overlap region.

According to some nonlimiting example embodiments, the first frequency band 40 spans from approximately 5 MHz up to an upper frequency limit of the first frequency band 40, and the second frequency band 50 spans from approximately 0 Hz up to approximately 10 MHz. According to one nonlimiting example embodiment, the upper frequency limit of the first frequency band is approximately 3 GHz. According to another nonlimiting example embodiment, the upper frequency limit of the first frequency band is approximately 170 MHz.

According to embodiments of the present invention, the combination unit 30 is adapted to determine, based on said signal content of the first and second digital signal in the common frequency sub band 60, at least one parameter indicating a mismatch between the first and the second signal path in the common frequency sub band 60. The at least one parameter may e.g. include a delay parameter, indicating a mutual delay between the first and the second signal path, and/or a gain parameter, indicating a gain mismatch between the first and the second signal path.

Furthermore, the combination unit 30 is adapted to generate a first compensated digital signal and a second compensated digital signal based on the first digital signal and the second digital signal, respectively, and on the at least one parameter for compensating the mismatch between the first and the second signal path in the common frequency sub band 60. The mismatch compensation may be performed entirely on one of the first and the second digital signal. For example, the mismatch compensation may be performed entirely on the first digital signal in the generation of the first compensated digital signal, whereas the second digital signal may be passed on untouched as the second compensated digital signal, or vice versa. Alternatively part of the mismatch compensation may be performed on each of the first and the second digital signal. For example, the first compensated digital signal may be generated based on the first digital signal and the delay parameter for compensating the mutual delay between the signal paths, and the second compensated digital signal may be generated based on the second digital signal and the gain parameter for compensating the gain mismatch between the signal paths, or vice versa.

In addition, the combination unit 30 is adapted to combine the first compensated digital signal and the second compensated digital signal for generating the digital output signal. For example, the combination unit 30 may be adapted to filter the first compensated digital signal with a first filter function for generating a first filtered digital signal, and to filter the second compensated digital signal with a second filter function for generating a second filtered digital signal. The second filter function may be essentially complementary to the first filter function, and the first filter function and the second filter function may have their transition bands (in the following referred to as "the merging band") within the frequency region, in which the first frequency band 40 and the second frequency band 50 overlap. The combination unit 30 may further be arranged to generate the digital output signal as the sum of the first filtered digital signal and the second filtered digital signal. Thereby, the first digital signal and the second digital signal, output from the first and the second ADC 20a, 20b, respectively, are effectively "glued together" to form the digital output signal of the digitizer device. Furthermore, due to the mismatch compensation, an overall approximately flat magnitude response over the combined frequency band (i.e. the union of the first and the second frequency band 40, 50) is obtained. If there exists a gain mismatch, which is not compensated for, a change in the overall magnitude response approximately shaped as a step would typically appear in the merging band. Similarly, if there exists a delay mismatch, which is not compensated for, a dip in the overall magnitude response would typically appear in the merging band.

The combination unit 30 can be adapted to continuously update the at least one parameter to compensate for drift in the mismatch between the two signal paths, which may e.g. be caused by temperature variations. Alternatively, updating of the at least one parameter may be triggered periodically, or by specific events, such as a command or push-down of a button issued by a user. An advantage of generating said at least one parameter indicating a mismatch between the signal paths, such as a mutual delay or gain mismatch, based on the signal content of the output signals from the ADCs 20a and 20b in the common frequency sub band 60 is that blind adaptation of the combination unit 30 to compensate for the mismatch between the signal paths is facilitated. No specific calibration or training sequence is required, neither is any dedicated calibration or training period. Instead, adaptation of the combination unit 30 can be performed online with the analog signal currently being digitized by the digitizer device 10.

The combination unit 30 may be adapted to generate the signal content of the second digital signal in the common frequency sub band, e.g. through filtering with a filter having a magnitude response similar to the magnitude response 65 shown in FIG. 2. Furthermore, the combination unit 30 may be adapted to generate a plurality of mutually delayed versions of the signal content of the first digital signal in the common frequency sub band 60. For example, the combination unit 30 may be adapted to generate a plurality of mutually delayed copies of the first digital signal, and filter each of the copies through a filter having the same, or essentially the same, frequency response as the filter used for generating the signal content of the second digital signal in the common frequency sub band, for generating said mutually delayed versions. Moreover, the combination unit 30 may be adapted to, for each of said mutually delayed versions, generate a correlation between that version and the signal content of the second digital signal in the common frequency sub band 60. The one of said plurality of mutually delayed version that results in the largest correlation has the best correspondence with the signal content of the second digital signal in the common frequency sub band 60. Therefore, it is possible to estimate the mutual delay between the first and the second signal path in the common frequency sub band 60 based on the generated correlations. Hence, in some embodiments, the combination unit 30 is adapted to determine the delay parameter based on the generated correlations.

Computer simulations have shown that, in many cases, it is possible to reduce the computational complexity, and yet obtain satisfactory estimation of the mutual delay between the first and the second signal path in the common frequency sub band 60, by generating each of said correlations as the correlation between the sign bit (instead of all bits) of the corresponding version and the sign bit of the signal content of the second digital signal in the common frequency sub band 60. Alternatively, in order to reduce computational complexity, the correlations may be computed based on two or more bits (for each sample), but not all bits, which results in a higher computational precision than if only the sign bit is considered. Hence, there is a trade-off between computational complexity and computational precision. The number of bits (of each sample) that is needed when generating the correlation for estimating the mutual delay between the first and the second signal path in the common frequency sub band with satisfactory precision may e.g. be determined from application to application based on computer simulations and/or measurements and requirements for that particular application.

The term correlation, when used in this specification, is not intended to be limited to any particular measure of the correlation between two signals. Any suitably measure, such as a covariance, correlation coefficient, or other quantity indicating the degree of correlation between the two signals may be used. For example, in the case where the correlation is determined only based on the sign bits, the correlation may be measured in terms of a number equal or proportional to the number of samples for which the sign bits of the two signals are equal.

The number of samples used for generating the above-mentioned correlations may e.g. be determined based on a tradeoff between speed and accuracy. The more samples that are used, the more accurately the correlations can be generated. On the other hand, with less samples used for generating the correlations, the more often the delay parameter can be updated. A suitable number of samples to be used for generating the correlations can e.g. be determined from application to application based on simulations and/or measurements.

Figure 3:
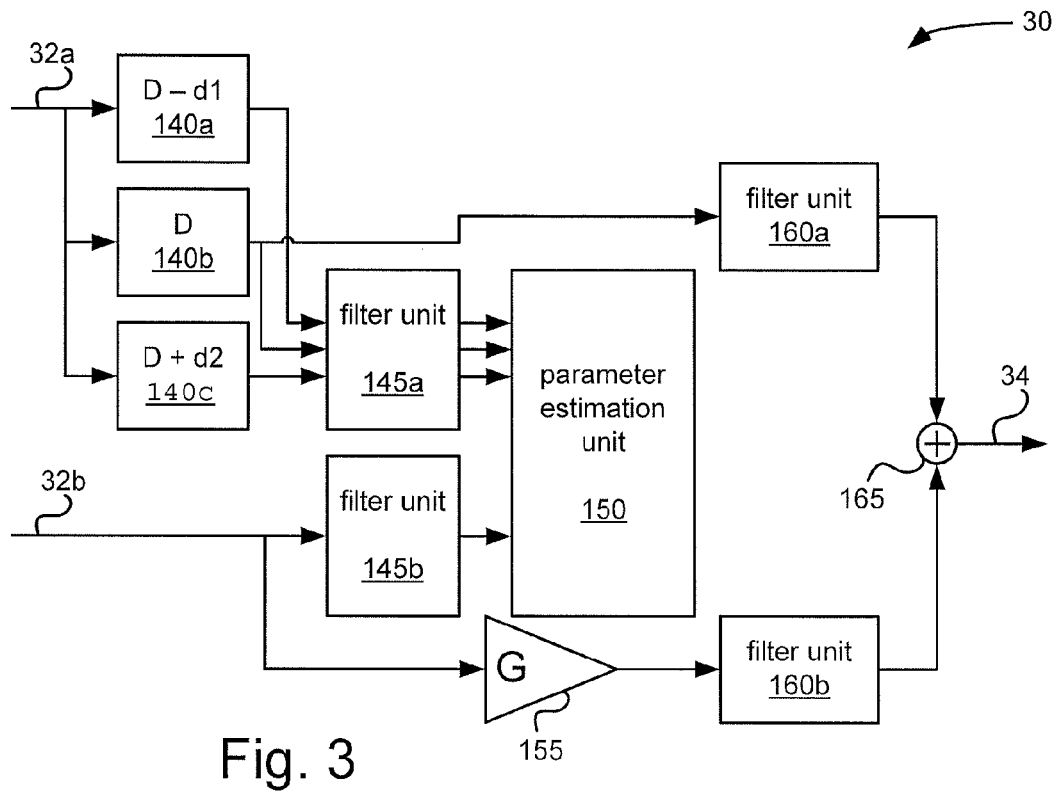
FIG. 3 is a block diagram of a combination unit according to an embodiment of the present invention.

FIG. 3 is a block diagram of the combination unit 30 according to an embodiment of the present invention. According to the embodiment, the combination unit 30 comprises three delay units 140a-c for generating mutually delayed copies of the first digital signal. Moreover, the combination unit 30 comprises two filter units 145a-b for generating signal content of the first and the second digital signals in the common frequency sub band 60. In addition, the combination unit 30 comprises a parameter estimation unit 150 for generating the at least one parameter. The combination unit 30 further comprises a gain element 155 for generating the second compensated digital signal based on the second digital signal and the gain parameter. In FIG. 3, the gain parameter is denoted "G" and the delay parameter is denoted "D". In the embodiment illustrated in FIG. 3, the combination unit 30 further comprises filter units 160a-b and an adder unit 165 for generating the digital output signal based on the first and second compensated digital signals. The filter unit 160a and 160b may be adapted to perform filtering with the above-mentioned complementary, or essentially complementary, first and second filter functions, respectively.

As indicated in FIG. 3, the delay unit 140a is adapted to generate a first delayed copy of the first digital signal having a delay D-dl with respect to the first digital signal (the delay may e.g. be defined in terms of number of clock periods of the sample clock used for generating the first digital signal, or any other suitable unit). Similarly, the delay unit 140b is adapted to generate a second delayed copy of the first digital signal having a delay D with respect to the first digital signal. Moreover, the delay unit 140c is adapted to generate a third delayed copy of the first digital signal having a delay D+d2 with respect to the first digital signal. As mentioned above, D is the delay parameter in this embodiment. Furthermore, d1 and d2 have positive nonzero values, such that D-d1 <D <D+d2. In an example embodiment, d1 =d2.

However, in general, d1 may be different from d2 as well.

The filter unit 145a is adapted to filter each of the first, second, and third delayed copies of the first digital signal to generate a first, second, and third mutually delayed version, respectively, of the signal content of the first digital signal in the common frequency sub band 60. The filter unit 145b is adapted to filter the second digital signal to generate the signal content of the second digital signal in the common frequency sub band 60. The filter units 145a and b may have a magnitude response similar to the magnitude response 65 shown in FIG. 2. As long as the filter units 145a and b are well matched (i.e. have the same or approximately the same frequency response), the specifications for the filter units 145a and 145b may normally be relatively relaxed. For example, it is normally not necessary that they have relatively small amounts of ripple in their passbands or provide approximately constant group delay. Hence, they can normally be implemented with a relatively low computational complexity. The degree of matching between the filter units 145a and 145b required for a given application may e.g. be determined based on computer simulations and/or measurements and requirements for that particular application.

The parameter estimation unit 150 is adapted to receive the said first, second, and third versions from the filter unit 145a, as well as the generated signal content of the second digital signal in the common frequency sub band 60 from the filter unit 145b. Furthermore, the parameter estimation unit 150 is adapted to generate the correlations between each of said first, second, and third version and the signal content of the second digital signal in the common frequency sub band 60. In the following, the correlation between the first version and the signal content of the second digital signal in the common frequency sub band 60 is denoted C1, the correlation between the second version and the signal content of the second digital signal in the common frequency sub band 60 is denoted C2, and the correlation between the third version and the signal content of the second digital signal in the common frequency sub band 60 is denoted C3. In order to find an appropriate value of the delay parameter D, the parameter estimation unit 150 is adapted to adjust the value of D such that correlation C2 is larger than both the correlation C1 and the correlation C3. In that case, the second delayed copy of the first digital signal (i.e. the output signal from the delay unit 140b) has a delay (i.e. D) that is better matched to the second digital signal (in the common frequency sub band 60) than the slightly shorter delay D−d1 and than the slightly longer delay D+d2. Hence, it can be concluded that an optimum, or close to optimum, value of D has been selected.

Because the signal contents in the common frequency sub band 60 of the first and second digital signals are generated by means of band-pass filtering, said signal contents normally have a roughly periodic appearance. This means that there are potentially a plurality of different values of D for which C2 is larger than both C1 and C3, of which only one value of D corresponds to the actual mutual delay between the first and the second signal path. Therefore, measures may need to be taken to avoid that D adopts a value corresponding to an incorrect period, which would result in that the first and second compensated digital signal would not be correctly aligned in time. The delays in the digital parts of the first and the second signal path can normally be predicted on beforehand and do not vary in time or with temperature, etc. Uncertainties and variations in the mutual delay between the first and the second signal paths are, hence, normally due to manufacturing inaccuracies and drift (e.g. due to temperature variations and aging) in parameters of analog components of the first and the second signal path. A nominal value of D may be determined based on the known delays in the digital parts and nominal component parameters for the analog components. Furthermore, maximum and minimum values of D may be determined based on the known delays in the digital parts and worst-case component parameters for the analog components. As an example of the above-mentioned measures to avoid that D adopts an incorrect value, said nominal value of D may be used as a start value for D when the digitizer device 10 is started. Alternatively, an appropriate start value for D may be determined, e.g. using a known dedicated training signal as an input signal to the digitizer device 10, e.g. as a part of manufacturing testing or calibration of the digitizer device 10. As a further example of such a measure, the value of D may be limited to a certain interval, such as between the above-mentioned maximum and minimum values of D, or an interval comprising these maximum and minimum values.

If C1 is larger than C2, the parameter estimation unit 150 may be adapted to adjust D by decreasing, or decrementing, the value of D. If on the other hand C3 is larger than C2, the parameter estimation unit 150 may be adapted to adjust D by increasing, or incrementing, the value of D. In the event that both C1 and C3 are larger than C2, various different approaches may be used for adjusting D. In one embodiment, such a result is discarded and D is left unchanged waiting for the next values of C1, C2, and C3 to be computed. In another embodiment, D is adjusted in a direction indicated by the largest of C1 and C3, i.e. increased if C3>C1 and decreased if C1>C3. In yet other embodiments, D may be increased or decreased randomly (e.g. based on a pseudo random sequence), in a case where both C1 and C3 are larger than C2.

In the embodiment illustrated in FIG. 3, the second delayed copy of the first digital signal, output from the delay unit 140b, is forwarded as the first compensated digital signal to the filter unit 160a.

As indicated in FIG. 3, the second compensated digital signal is in this embodiment generated by multiplying the second digital signal with the gain parameter G. The parameter estimation unit 150 may be adapted to generate the gain parameter G based on energies of the signal contents in the common frequency sub band of the first digital signal and the second digital signal. For example, the parameter estimation unit 150 may be adapted to compute the signal energy E1 of the signal content of the first digital signal in the common frequency sub band 60 during a particular time period and the signal energy E2 of the signal content of the second digital signal in the common frequency sub band 60 during the same particular time period. Furthermore, the parameter estimation unit 150 may be adapted to generate the gain parameter as $G=(E1/E2)^{1/2}$. In an alternative embodiment, the gain parameter G may be determined based on average absolute sample values of the signal contents in the common frequency sub band 60 of the first and the second digital signal. For example, let A1 and A2 denote the average absolute sample values (over a given range of samples) of the signal contents in the common frequency sub band 60 of the first and the second digital signal, respectively. The gain parameter G may then be generated as $G=A1/A2$. Alternatively, if instead the generation of the first compensated digital signal would include multiplication of the first digital signal (or e.g. a delayed version thereof) with the gain parameter G, the gain parameter G may instead be generated as $G=(E2/E1)^{1/2}$ or $G=A2/A1$.

In some embodiments, the first ADC 20a and the second ADC 20b (FIG. 1) may be arranged to operate at different sample rates. Consider e.g. the examples presented above in the context of FIG. 2, wherein the first frequency band 40 (FIG. 2) has an upper frequency limit of 3 GHz or 170 MHz, whereas the second frequency band 50 (FIG. 2) has an upper frequency limit of 10 MHz, the second ADC 20b may be arranged to operate at a significantly lower sample rate than the first ADC 20a. Hence, the design specification in terms of sample rate of the second ADC 20b may be considerably relaxed in comparison with the first ADC 20a, which can normally be utilized to reduce the production cost and complexity in comparison with using an ADC as the second ADC 20b with the same (harder) design specification as that of the first ADC 20a.

In an example embodiment, where the upper frequency limit of the first frequency band 40 is 3 GHz and the upper frequency limit of the second frequency band 50 is 10 MHz, the first ADC 20a is arranged to operate at a sample rate of 7 GHz and the second ADC 20b is arranged to operate at a sample rate of 54.6875 MHz, i.e. a factor 128 lower than for the first ADC 20b. In order to obtain such a relatively high sample rate for the first ADC 20a, the first ADC 20a may be implemented as a time-interleaved (TI) ADC, comprising a plurality of sub ADCs (not shown), each operating at a lower sample rate than the total sample rate of the TI ADC. For example, the first ADC 20a may be implemented as a TI ADC having four sub ADCs, each operating at a sample rate of 1.75 GHz (=7 GHz/4) and being responsible for converting every fourth sample of the input signal to the first ADC 20a. The first ADC 20a may also comprise processing circuitry (not shown) for compensating mismatch between the individual sub ADCs. Examples of such compensation are e.g. disclosed in WO 2008/156400 A1 and WO 2008/156401 A1.

If the first ADC 20*a* is arranged to operate at a higher sample rate than the second ADC 20*b*, then the first digital signal will have a higher sample rate than the second digital signal. In order to facilitate the generation of the above-mentioned correlations, the combination unit 30 may be adapted to perform decimation on one or more signals derived from the first digital signal in order to generate signal content of the first digital signal in the common frequency sub band 60 with the same sample rate as the signal content of the second digital signal in the common frequency sub band 60. With reference to FIG. 3, the filter unit 145*a* may be adapted to perform the decimation. For example, in the example embodiment described above, where the sample rate of the first ADC 20*a* is a factor 128 higher than the sample rate of the second ADC 20*b*, the filter unit 145*a* may be adapted to decimate each of the output signals from the delay units 140*a*-*c* with a factor 128, and then filter each of thereby generated decimated signals with a filter function identical to the filter function of the filter unit 145*b*.

In an alternative embodiment, the combination unit 30 is adapted to generate the signal contents in the common frequency sub band 60 of the first and the second digital signal with an intermediate sample rate somewhere in between the sample rate of the first digital signal and the second digital signal. In that case, the combination unit 30 may be adapted to perform decimation on a signal derived from the first digital signal for generating signal content of the first digital signal in the common frequency sub band 60 with the intermediate sample rate and to perform interpolation on a signal derived from the second digital signal for generating the signal content of the second digital signal in the common frequency sub band 60 with the intermediate sample rate. Said decimation may, again, e.g. be performed by the filter unit 145*a* (FIG. 3). Similarly, said interpolation may e.g. be performed by the filter unit 145*b* (FIG. 3).

Similarly, in order to facilitate the generation of the digital output signal, the combination unit 30 may be adapted to perform interpolation in the signal path between the second ADC 20*b* and the output port 34. For example, with reference to FIG. 3, the combination unit 30 may be adapted to perform said interpolation such that both signals input to the adder unit 165 have the same sample rate. Again with reference to the example embodiment described above, where the sample rate of the first ADC 20*a* is a factor 128 higher than the sample rate of the second ADC 20*b*, the filter unit 160*b* may be adapted to perform interpolation with a factor 128. The interpolation may e.g. be performed by means of inserting 127 zero-valued samples between each consecutive pair of input samples to the filter unit 160*b*, followed by filtering with the above-mentioned second filter function, which is complementary or essentially complementary to said first filter function of the filter unit 160*a*. An equivalent operation may be obtained by implementing the filter unit 160*b* by means of polyphase decomposition. The principles of polyphase decomposition are known in the field of multi-rate signal processing, and are not further described herein.

In the embodiment illustrated in FIG. 3, the mutual delay between the first and the second signal path of the digitizer device 10 is compensated for in the signal path from the input port 32*a* to the output port 34, whereas the gain mismatch is compensated for in the signal path from the input port 32*b* to the output port 34. In other embodiments, the mutual delay between the first and the second signal path of the digitizer device 10 may instead be compensated for in the signal path from the input port 32*b* to the output port 34, whereas the gain mismatch is instead compensated for in the signal path from the input port 32*a* to the output port 34. In yet other embodiments, both the mutual delay and the gain mismatch may be compensated for in either the signal path from the input port 32*a* to the output port 34 or the signal path from the input port 32*b* to the output port 34. In further other embodiments, the mutual delay and/or the gain mismatch may be compensated for partly in the signal path from the input port 32*a* to the output port 34 or the signal path from the input port 32*b* to the output port 34. However, in a case where the first ADC 20*a* operates at a higher sample rate than the second ADC 20*b*, compensating the mutual delay in the signal path from the input port 32*a* to the output port 34 and the gain mismatch in the signal path from the input port 32*b* to the output port 34 has a few advantages. First of all, a multiplier (such as the gain element 155 in FIG. 3) arranged to compensate for the gain mismatch can operate at a lower sample rate if the gain mismatch is compensated for in the signal path from the input port 32*b* to the output port 34 compared with if the gain mismatch were to be compensated for in the signal path from the input port 32*a* to the output port 34. At the same time, if the delay parameter is to be tuned in steps corresponding to a sample period (which enables a circuit implementation with a relatively low complexity), the delay parameter can be tuned with a higher resolution (i.e. in smaller steps) compared with if the mutual delay were to be compensated for in the signal path from the input port 32*b* to the output port 34, since the first digital signal in that case has a higher sample rate than the second digital signal. However, it is possible to tune the delay parameter in smaller steps than the sample period of the second digital signal also in the case where the mutual delay is to be compensated for in the signal path from the input port 32*b* to the output port 34, e.g. by using interpolation to increase the sample rate or by using fractional-delay filters.

For reasons of causality, it is only possible to compensate for a mutual delay between the first and the second signal paths by introducing additional delays (i.e., it is not possible to compensate for a mutual delay by advancing a signal). Consider e.g. the embodiments illustrated in FIGS. 1 and 3. If the overall delay from the input port 15 of the digitizer device 10 to the input port 32*b* of the combination unit 30 is shorter than the corresponding delay from the input port 15 of the digitizer device 10 to the input port 32*a* of the combination unit 30, the delay introduced in the combination unit 30 in the signal path from the input port 32*b* to the output port 34 needs to be longer than the corresponding delay introduced in the signal path from the input port 32*b* to the output port 34. Hence, additional delay elements (not shown) may need to be inserted in the path from the input port 32*b* to the output port 34*b* in order to facilitate compensation of the mutual delay between the first and the second signal path by means of the tunable delay introduced by the delay unit 140*b* (FIG. 3). If a short overall delay from the input port 15 (FIG. 1) to the output port 34 (FIG. 1) is desired, it may in such a case be beneficial to compensate for the mutual delay by means of a tunable delay introduced in the signal path between the input port 32*b* and the output port 34 instead, whereby the aforementioned additional delay elements may be avoided.

Figure 4:
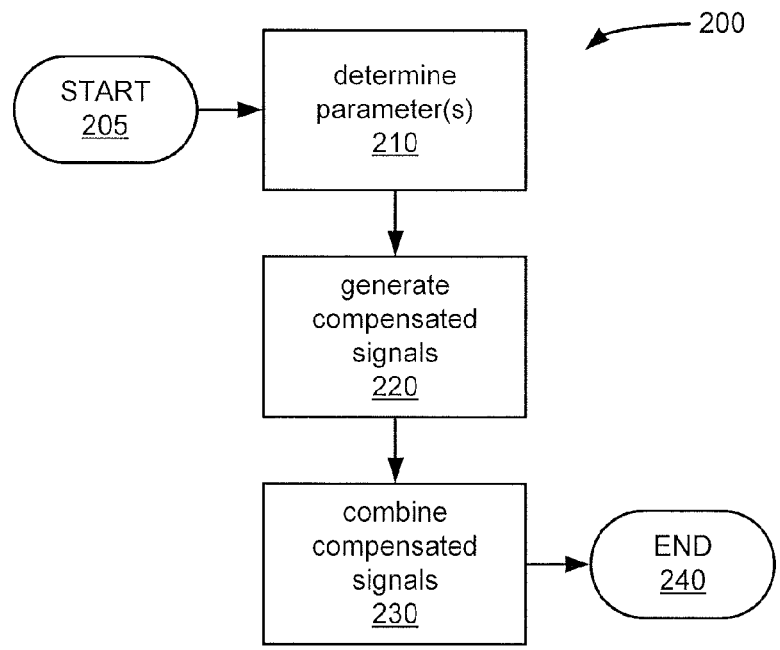
FIGS. 4-10 are flowcharts for methods according to embodiments of the present invention.

According to some embodiments of the present invention, there is provided a method of processing signals in the digitizer device 10 (FIG. 1). The method may e.g. be performed by the combination unit 30 (FIG. 1). FIG. 4 is a flowchart of an embodiment of the method, which is denoted with the reference number 200 in FIG. 4. The method is started in step 205. In step 210, the at least one parameter indicating a mismatch between the first and the second signal path in the common frequency sub band 60 is determined based on signal content of the first and second digital signal in the common frequency sub band 60. In step 220, the first compensated digital signal and the second compensated digital signal are generated based on the first digital signal and the second digital signal, respectively, and on the at least one parameter for compensating the mismatch between the first and the second signal path in the common frequency sub band 60. Furthermore, in step 230, the first compensated digital signal and the second compensated digital signal are combined for generating the digital output signal of the digitizer device 10. The method is ended in step 240.

Figure 5:
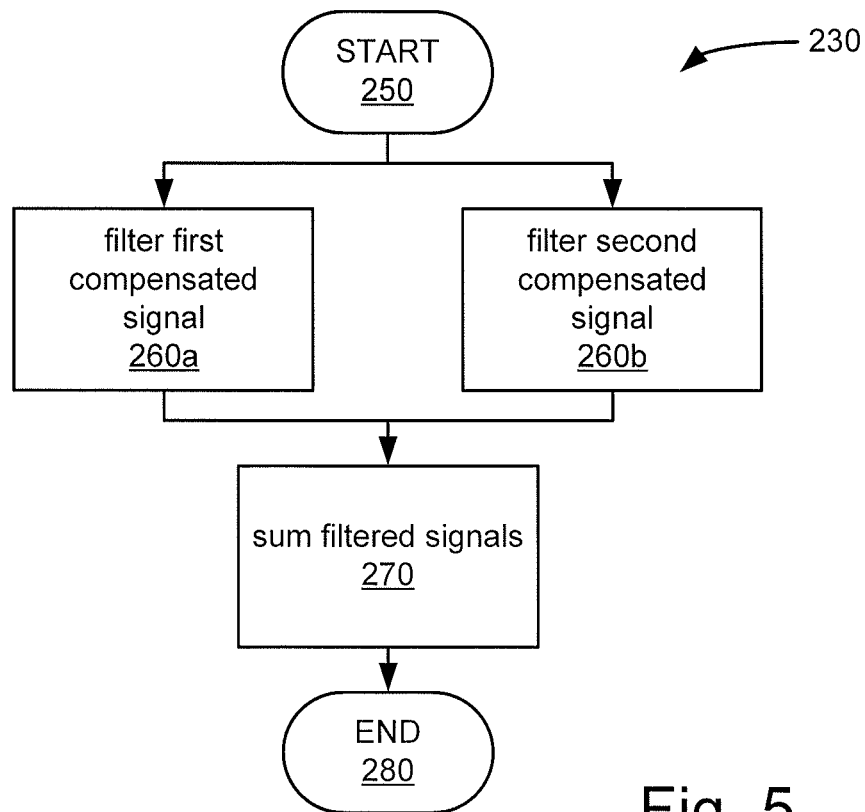

FIG. 5 is a flowchart of the step 230 in FIG. 4 according to an embodiment of the present invention. The operation is started in step 250. In step 260*a*, the first compensated digital signal is filtered, e.g. in the filter unit 160*a* (FIG. 3), with the above-mentioned first filter function for generating the above-mentioned first filtered digital signal. Similarly, in step 260*b*, the second compensated digital signal is filtered, e.g. in the filter unit 160*b* (FIG. 3), with the above-mentioned second filter function for generating the above-mentioned second filtered digital signal. In step 270, the digital output signal is generated, e.g. in the adder unit 165 (FIG. 3), as the sum of the first filtered digital signal and the second filtered digital signal.

Figure 6:
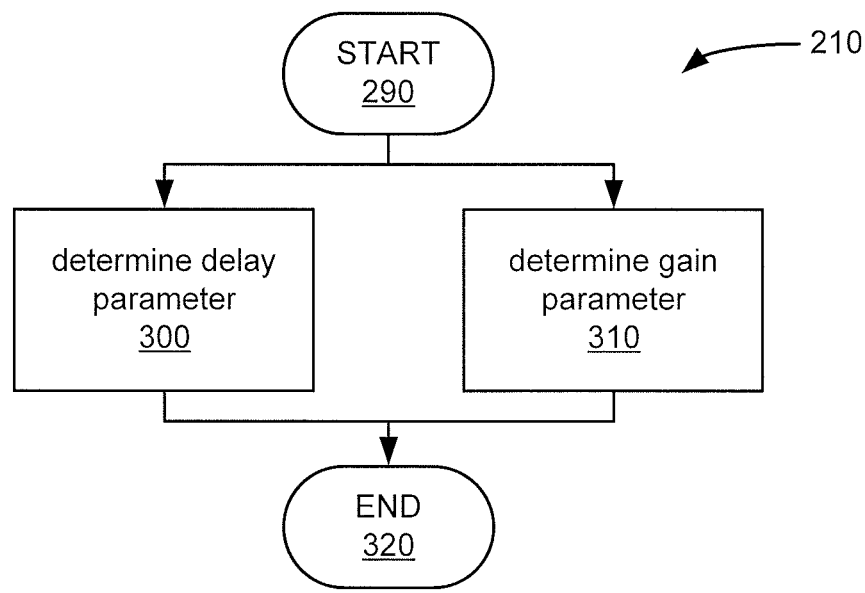

FIG. 6 is a flowchart of the step 210 in FIG. 4 according to an embodiment of the present invention. The operation is started in step 290. In step 300, the delay parameter is determined, e.g. by the parameter estimation unit 150 (FIG. 3). In step 310, the gain parameter is determined, e.g. by the parameter estimation unit 150 (FIG. 3). The operation is ended in step 320. In some embodiments, step 300 is omitted, and only the gain parameter is generated in step 210. In other embodiments, step 310 is omitted, and only the delay parameter is generated in step 210. Alternatively or additionally, other parameters than the gain parameter and the delay parameter indicating a mismatch between the first and the second signal path of the digitizer device 10 may be generated as well in step 210.

Figure 7:
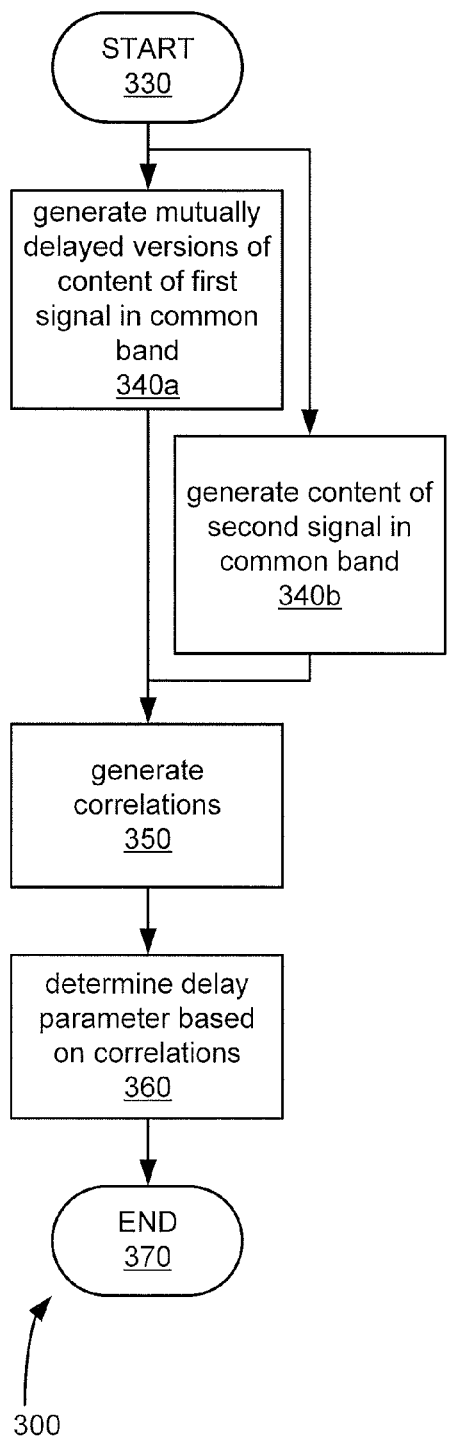

FIG. 7 is a flowchart of the step 300 in FIG. 6 according to an embodiment of the present invention. The operation is started in step 330. In step 340*a*, the above-mentioned plurality of mutually delayed versions of the signal content of the first digital signal in the common frequency sub band 60 are generated. Similarly, in step 340*b*, the content of the second digital signal in the common frequency sub band 60 is generated. Furthermore, for each of said versions, the above-mentioned correlation between that version and the signal content of the second digital signal in the common frequency sub band 60 is generated in step 350. Moreover, in step 360, the delay parameter is determined based on the generated correlations. The operation is ended in step 370.

Figure 8:
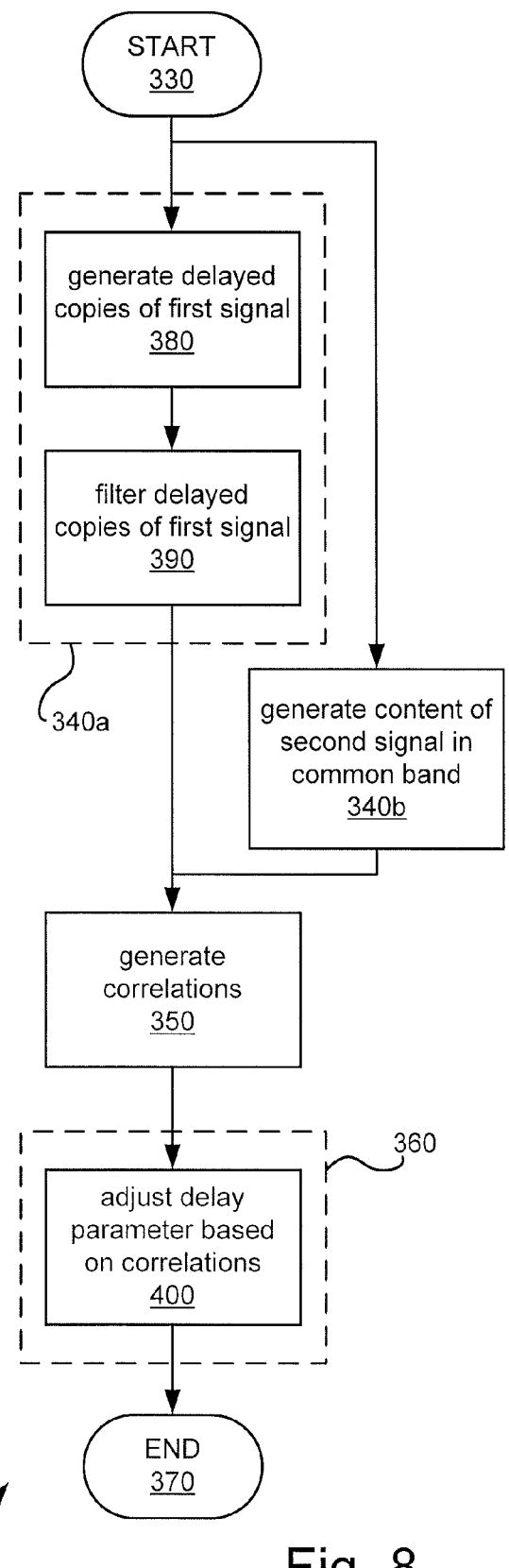

FIG. 8 is a flowchart of the step 300 in FIG. 6 according to an embodiment of the present invention. Steps that are similar or the same as steps in the flowchart of FIG. 7 are denoted with the same reference numbers in FIG. 8 as in FIG. 7. In the embodiment illustrated in FIG. 8, the step 340*a* comprises steps 380 and 390. In step 380, the above-mentioned first, second, and third delayed copy of the first digital signal, having a delay D−d1, D, and D+d2, respectively, with respect to the first digital signal are generated. Step 380 may e.g. be performed by the delay units 140*a-c* (FIG. 3). In step 390, each of the first, second, and third delayed copy of the first digital signal is filtered to generate the above-mentioned first, second, and third one, respectively, of the mutually delayed versions of the signal content of the first digital signal in the common frequency sub band 60. Step 390 may e.g. be performed by the filter unit 145*a* (FIG. 3). Step 340*b* may comprise filtering the second digital signal, e.g. in the filter unit 145*b* (FIG. 3), to generate the signal content of the second digital signal in the common frequency sub band 60.

Furthermore, in FIG. 8, step 360 comprises the step 400. In step 400, the delay parameter is adjusted such that the correlation between the second one of said versions and the signal content of the second digital signal in the common frequency sub band 60 is larger than the correlation between the first one of said versions and the signal content of the second digital signal in the common frequency sub band 60 and larger than the correlation between the third one of said versions and the signal content of the second digital signal in the common frequency sub band 60. Steps 350 and 400 may e.g. be performed by the parameter estimation unit 150 (FIG. 3). As described in the context of FIG. 3, the second delayed copy of the first digital signal may be the first compensated digital signal.

Figure 9:
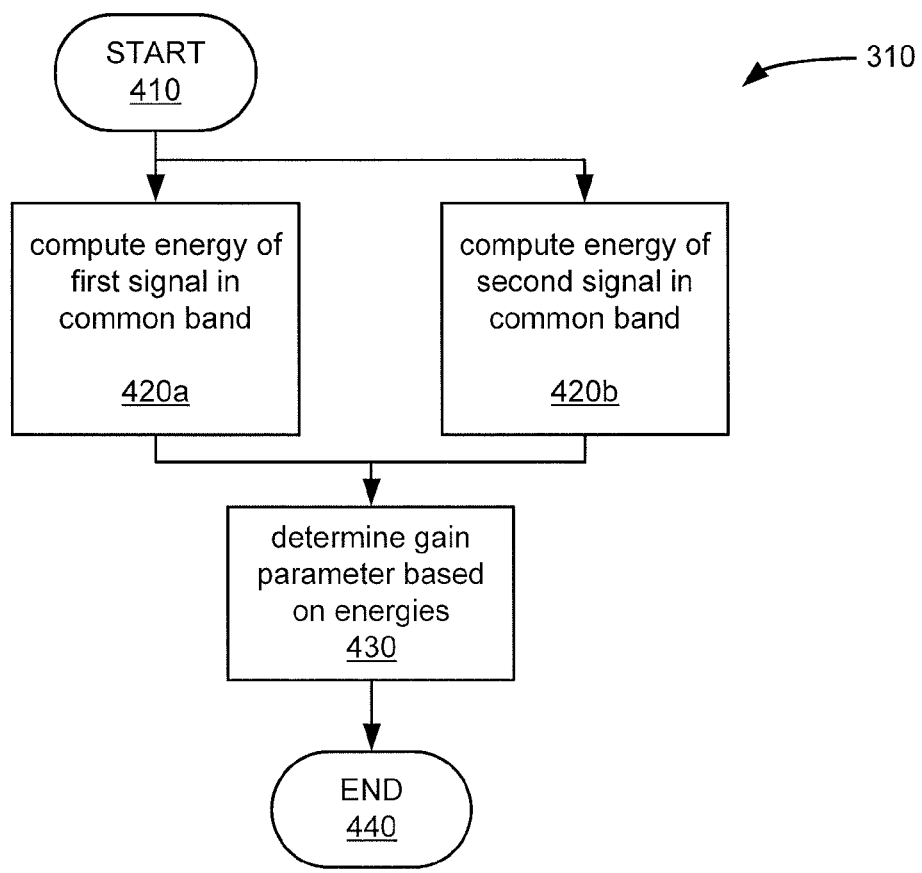

FIG. 9 is a flowchart of step 310 in FIG. 6 according to an embodiment of the present invention. The operation is started in step 410. In step 420*a*, the above-mentioned signal energy E1 of the signal content of the first digital signal in the common frequency sub band 60 is generated. Furthermore, in step 420*b*, the above-mentioned signal energy E2 of the signal content of the second digital signal in the common frequency sub band 60 is generated. Moreover, in step 430, the gain parameter is generated based on the generated signal energies E1 and E2. The steps in the flowchart in FIG. 9 may e.g. be performed by the parameter estimation unit 150 (FIG. 3).

In an alternative embodiment, step 310 may comprise generating the gain parameter based on average absolute sample values of the signal contents in the common frequency sub band 60 of the first digital signal and the second digital signal.

Generating the second compensated digital signal may comprise multiplying (e.g. in the gain element 155 (FIG. 3)) the second digital signal with the gain parameter.

In embodiments wherein the first ADC 20*a* (FIG. 1) is arranged to operate at a higher sample rate than the second ADC 20*b* (FIG. 1), the method 200 (FIG. 4) may comprise performing decimation on a signal derived from the first digital signal for generating signal content of the first digital signal in the common frequency sub band 60 with the same sample rate as the signal content of the second digital signal in the common frequency sub band 60, e.g. by the filter unit 145*a* as described above with reference to FIG. 3. Alternatively, the method 200 may comprise generating the signal contents in the common frequency sub band 60 of the first and the second digital signal with an intermediate sample rate somewhere in between the sample rate of the first digital signal and the second digital signal. In that case, the method 200 may comprise performing decimation (e.g. in the filter unit 145*a* in FIG. 3) on a signal derived from the first digital signal for generating signal content of the first digital signal in the common frequency sub band 60 with the intermediate sample rate and performing interpolation (e.g. in the filter unit 145*b* in FIG. 3) on a signal derived from the second digital signal for generating the signal content of the second digital signal in the common frequency sub band 60 with the intermediate sample rate.

Furthermore, the method 200 may comprise performing interpolation on a signal derived from the second digital signal for facilitating generation of the digital output signal of the digitizer device 10, e.g. by the filter unit 160*b* as described above with reference to FIG. 3.

Figure 10:
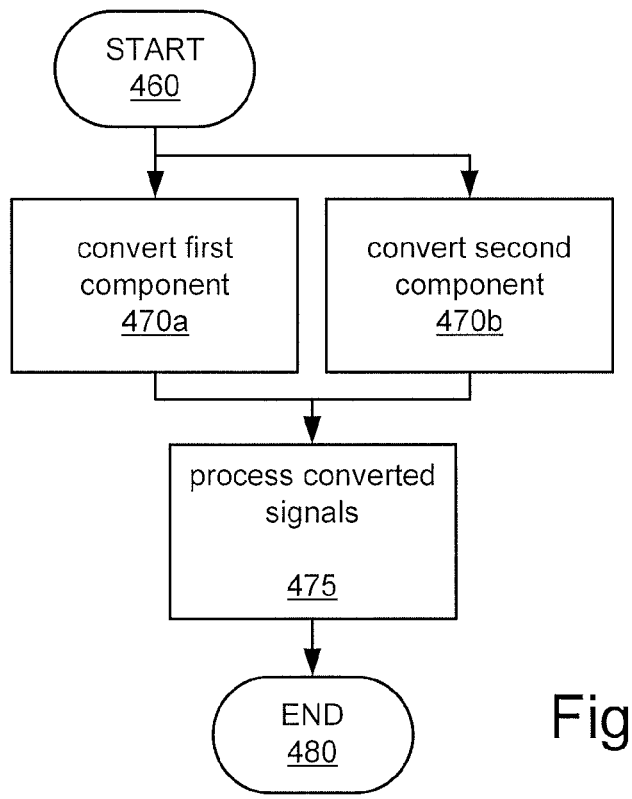

According to some embodiments of the present invention, a method of generating the digital output signal of the digitizer device 10 (FIG. 1) is provided. FIG. 10 is a flowchart for an embodiment of the method. The method is started in step 460. In step 470*a*, the above-mentioned first component of the analog input signal, residing in the first frequency band 40 (FIG. 2), is converted to the first digital signal. Step 470a may e.g. be performed by the first ADC 20a (FIG. 1). Furthermore, in step 470b, the above-mentioned second component of the analog input signal, residing in the second frequency band 50 (FIG. 2), to the second digital signal. Step 470b may e.g. be performed by the second ADC 20b (FIG. 1). Moreover, in step 475, the first and second digital signals are processed in accordance with the method 200, which has been described above in the context of various embodiments with reference to FIGS. 4-9.

It should be noticed that various modifications could be made to the methods illustrated in FIGS. 4-10. For example, although steps illustrated in FIG. 4-10, for simplicity, have been shown as steps being executed in sequence, some or all of these steps may represent continually ongoing processes being executed in parallel. For example, with reference to FIG. 4, step 210 of determining the at least one parameter indicating a mismatch may be repeated continuously or periodically as necessary to update the at least one parameter. At the same time, samples of the compensated first and second digital signals may be generated in step 220 based on the current values of the at least one parameter, simultaneously as other (already generated) samples of the compensated first and second digital signals are used in step 230 to generate samples of the output signal of the digitizer device 10.

Figure 11:
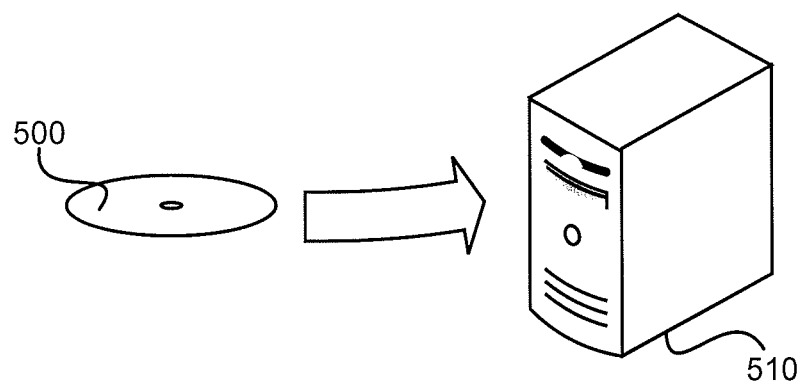
FIG. 11 schematically illustrates a computer-readable medium and an electronic device according to an embodiment of the present invention.

In some embodiments, the combination unit 30 (FIGS. 1 and 3) may be implemented as a dedicated application-specific hardware unit. Alternatively, the combination unit 30, or parts thereof, may be implemented with programmable and/or configurable hardware units, such as but not limited to one or more field-programmable gate arrays (FPGAs), processors, or microcontrollers. Hence, embodiments of the present invention may be embedded in a computer program product, which enables implementation of the method and functions described herein, e.g. the embodiments of the method 200 of processing signals described above with reference to FIGS. 4-9. Therefore, according to embodiments of the present invention, there is provided a computer program product, comprising instructions arranged to cause a programmable hardware unit with processing capabilities, such as the aforementioned one or more processors or micro controllers, to perform the steps of any of the embodiments of said method. The computer program product may comprise program code which is stored on a computer readable medium 500, as illustrated in FIG. 11, which can be loaded and executed by a programmable hardware unit 510 having processing capabilities, to cause it to perform the steps of any of the embodiments of said method. The programmable hardware unit 510 having processing capabilities is preferably what normally is referred to as an embedded system. Thus, the depicted programmable hardware unit 510, illustrated in FIG. 11 as a computer, and computer readable medium 500 in FIG. 11 should be construed to be for illustrative purposes only to provide understanding of the principle, and not to be construed as any direct illustration of the elements.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. A device for generating a digital output signal by digitizing an analog input signal, comprising:
   a first signal path including a first analog-to-digital converter arranged to convert a first component of the analog input signal, residing in a first frequency band, to a first digital signal; and
   a second signal path including a second analog-to-digital converter arranged to convert a second component of the analog input signal, residing in a second frequency band, to a second digital signal;
   wherein the first and the second frequency bands overlap, such that there is a common frequency sub band, which is included in both the first and the second frequency bands; and
   a combination unit adapted to:
   determine, based on signal content of the first and the second digital signals in the common frequency sub band, at least one parameter indicating a mismatch between the first and the second signal paths in the common frequency sub band, wherein one of the at least one parameter is a gain parameter indicating a gain mismatch between the first and the second signal paths;
   generate a first compensated digital signal and a second compensated digital signal based on the first digital signal and the second digital signal, respectively, and on the at least one parameter for compensating the mismatch between the first and the second signal paths in the common frequency sub band; and
   combine the first compensated digital signal and the second compensated digital signal for generating the digital output signal.

2. The device according to claim 1, wherein the combination unit is adapted to:
   filter the first compensated digital signal with a first filter function for generating a first filtered digital signal;
   filter the second compensated digital signal with a second filter function for generating a second filtered digital signal; and
   generate the digital output signal as the sum of the first filtered digital signal and the second filtered digital signal;
   wherein the second filter function is essentially complementary to the first filter function; and
   wherein the first filter function and the second filter function have their transition bands within the frequency region in which the first frequency band and the second frequency band overlap.

3. The device according to claim 1, wherein one of the at least one parameter is a delay parameter indicating a mutual delay between the first and the second signal paths.

4. The device according to claim 3, wherein the combination unit is adapted to:
   generate a plurality of mutually delayed versions of the signal content of the first digital signal in the common frequency sub band;
   for each of the versions, generate a correlation between that version and the signal content of the second digital signal in the common frequency sub band; and
   determine the delay parameter based on the generated correlations.

5. The device according to claim 4, wherein each of the correlations is a correlation between a sign bit of the version and a sign bit of the signal content of the second digital signal in the common frequency sub band.

6. The device according to claim 1, wherein the combination unit is adapted to generate the gain parameter based on energies of the signal contents in the common frequency sub band of the first digital signal and the second digital signal.

7. The device according to claim 1, wherein the combination unit is adapted to generate the gain parameter based on average absolute sample values of the signal contents in the common frequency sub band of the first digital signal and the second digital signal.

8. The device according to claim 1, wherein the combination unit is adapted to one of:
  multiply the first digital signal with the gain parameter for generating the first compensated digital signal; and
  multiply the second digital signal with the gain parameter for generating the second compensated digital signal.

9. The device according to claim 1, wherein the first signal path has a band-pass characteristic and the second signal path has a low-pass characteristic.

10. The device according to claim 1, wherein the device comprises a passive circuit for generating a differential input signal to the first analog-to-digital converter.

11. The device according to claim 10, wherein the passive circuit is a balun.

12. A method of processing signals in a device for generating a digital output signal by digitizing an analog input signal, the device including
  a first signal path with a first analog-to-digital converter arranged to convert a first component of the analog input signal, residing in a first frequency band, to a first digital signal, and
  a second signal path with a second analog-to-digital converter arranged to convert a second component of the analog input signal, residing in a second frequency band, to a second digital signal,
  wherein the first and the second frequency bands overlap, such that there is a common frequency sub band, which is included in both the first and the second frequency bands,
  the method comprising:
  determining, based on signal content of the first and the second digital signals in the common frequency sub band, at least one parameter indicating a mismatch between the first and the second signal paths in the common frequency sub band, wherein one of the at least one parameter is a gain parameter indicating a gain mismatch between the first and the second signal paths;
  generating a first compensated digital signal and a second compensated digital signal based on the first digital signal and the second digital signal, respectively, and on the at least one parameter for compensating the mismatch between the first and the second signal paths in the common frequency sub band; and
  combining the first compensated digital signal and the second compensated digital signal for generating the digital output signal.

13. The method according to claim 12, wherein combining the first and the second compensated digital signals comprises:
  filtering the first compensated digital signal with a first filter function for generating a first filtered digital signal;
  filtering the second compensated digital signal with a second filter function for generating a second filtered digital signal; and
  generating the digital output signal as the sum of the first filtered digital signal and the second filtered digital signal;
  wherein the second filter function is essentially complementary to the first filter function; and
  wherein the first filter function and the second filter function have their transition bands within the frequency region in which the first frequency band and the second frequency band overlap.

14. The method according to claim 12, wherein one of the at least one parameter is a delay parameter indicating a mutual delay between the first and the second signal paths.

15. The method according to claim 14, wherein determining the delay parameter comprises:
  generating a plurality of mutually delayed versions of the signal content of the first digital signal in the common frequency sub band;
  for each of the versions, generating a correlation between that version and the signal content of the second digital signal in the common frequency sub band; and
  determining the delay parameter based on the generated correlations.

16. The method according to claim 15, wherein each of the correlations is a correlation between a sign bit of the version and a sign bit of the signal content of the second digital signal in the common frequency sub band.

17. The method according to claim 12, wherein generating the gain parameter comprises generating the gain parameter based on energies of the signal contents in the common frequency sub band of the first digital signal and the second digital signal.

18. The method according to claim 12, wherein generating the gain parameter comprises generating the gain parameter based on average absolute sample values of the signal contents in the common frequency sub band of the first digital signal and the second digital signal.

19. The method according to claim 12, wherein one of:
  generating the first compensated digital signal comprises multiplying the first digital signal with the gain parameter; and
  generating the second compensated digital signal comprises multiplying the second digital signal with the gain parameter.

20. The method according to claim 12, wherein the first signal path has a band-pass characteristic and the second signal path has a low-pass characteristic.

21. A method of generating a digital output signal by digitizing an analog input signal, comprising:
  generating the digital output signal using the method according to claim 12;
  converting the first component of the analog input signal, residing in the first frequency band, to the first digital signal; and
  converting the second component of the analog input signal, residing in the second frequency band, to the second digital signal.

22. A computer program product comprising computer program code means for executing the method according to claim 12 when the computer program code means are run by an electronic device having computer capabilities.

23. A non-transitory computer readable medium having stored thereon a computer program product comprising computer program code means for executing the method according to claim 12 when the computer program code means are run by an electronic devices having computer capabilities.

* * * * *